(12) United States Patent
Nagasato et al.

(10) Patent No.: US 9,666,580 B1
(45) Date of Patent: May 30, 2017

(54) NITRIDE SEMICONDUCTOR DEVICE AND METHOD OF MANUFACTURING THE SAME

(71) Applicant: TOYOTA JIDOSHA KABUSHIKI KAISHA, Toyota-shi, Aichi-ken (JP)

(72) Inventors: Yoshitaka Nagasato, Toyota (JP); Hidemoto Tomita, Toyota (JP); Masakazu Kanechika, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/291,744

(22) Filed: Oct. 12, 2016

(30) Foreign Application Priority Data

Nov. 27, 2015 (JP) .................................. 2015-232371

(51) Int. Cl.
| | |
|---|---|
| *H01L 21/02* | (2006.01) |
| *H01L 27/085* | (2006.01) |
| *H01L 29/778* | (2006.01) |
| *H01L 29/40* | (2006.01) |
| *H01L 29/49* | (2006.01) |

(Continued)

(52) U.S. Cl.
CPC ........ *H01L 27/085* (2013.01); *H01L 21/0254* (2013.01); *H01L 21/02381* (2013.01); *H01L 21/02458* (2013.01); *H01L 21/76224* (2013.01); *H01L 29/205* (2013.01); *H01L 29/402* (2013.01); *H01L 29/432* (2013.01);
(Continued)

(58) Field of Classification Search
CPC ......... H01L 21/02381; H01L 21/02458; H01L 21/0254; H01L 21/76224; H01L 29/205; H01L 29/432; H01L 29/4916; H01L 29/7786; H01L 29/2003; H01L 27/085
See application file for complete search history.

(56) References Cited

U.S. PATENT DOCUMENTS 4,615,102 A * 10/1986 Suzuki .............. H01L 21/30621
257/E21.222
5,302,840 A * 4/1994 Takikawa ............ H01L 27/0605
257/11

(Continued)

FOREIGN PATENT DOCUMENTS

| JP | H9-139438 | 5/1997 |
| JP | 2008-235740 A | 10/2008 |
| JP | 2010-109322 | 5/2010 |

OTHER PUBLICATIONS

US 6,104,076, 08/2000, Nakayama (withdrawn)

(Continued)

*Primary Examiner* — Yosef Gebreyesus
(74) *Attorney, Agent, or Firm* — Oliff PLC (57) ABSTRACT

A nitride semiconductor device includes a conductive substrate and a nitride semiconductor layer. The nitride semiconductor layer is disposed on the conductive substrate. The nitride semiconductor layer includes a first transistor structure of a lateral type and a second transistor structure of a lateral type. The conductive substrate includes a first potential control region and a second potential control region capable of controlling potential independently from the first potential control region. In planar view of the nitride semiconductor layer, the first transistor structure overlaps the first potential control region and the second transistor structure overlaps the second potential control region.

13 Claims, 9 Drawing Sheets

(51) Int. Cl.
*H01L 29/205* (2006.01)
*H01L 29/43* (2006.01)
*H01L 21/762* (2006.01)
*H01L 29/20* (2006.01)

(52) U.S. Cl.
CPC ...... *H01L 29/4916* (2013.01); *H01L 29/7786* (2013.01); *H01L 29/2003* (2013.01)

(56) References Cited

U.S. PATENT DOCUMENTS

| | | | | | |
|---|---|---|---|---|---|
| 5,514,605 | A | * | 5/1996 | Asai | H01L 21/8252 257/E21.697 |
| 5,681,766 | A | * | 10/1997 | Tserng | H01L 21/8252 148/DIG. 72 |
| 6,078,067 | A | * | 6/2000 | Oikawa | H01L 27/0605 257/192 |
| 2010/0019279 | A1 | * | 1/2010 | Chen | H01L 27/0605 257/194 |
| 2010/0109015 | A1 | | 5/2010 | Ueno | |
| 2012/0153427 | A1 | | 6/2012 | Chen et al. | |

OTHER PUBLICATIONS

Chen et al., "High-Voltage Enhancement/Depletion-mode AlGaN/GaN HEMTs on Modified SOI Substrates," ISPSD, 2013, p. 407-410.

Uemoto et al., "GaN Monolithic Inverter IC using Normally-off Gate Injection Transistors with Planar Isolation on Si Substrate," IEDM Tech. Dig. 2009, p. 165-168.

Chen et al., "High-Voltage Enhancement/Depletion-mode AlGaN/GaN HEMTs on Modified SOI Substrates," ISPDS, 2013, p. 407-410.

* cited by examiner

NITRIDE SEMICONDUCTOR DEVICE AND METHOD OF MANUFACTURING THE SAME

TECHNICAL FIELD

The present disclosure provides an art related to a nitride semiconductor device and a method of manufacturing the same.

DESCRIPTION OF RELATED ART

A nitride semiconductor device that has a plurality of transistor structures provided in one nitride semiconductor layer is disclosed in a literature ""GaN Monolithic Inverter IC using Normally-off Gate Injection Transistors with Planar Isolation on Si Substrate", IEDM Tech. Dig. 2009, p. 165-168." (hereinafter referred to as Literature 1). In the nitride semiconductor device in Literature 1, a plurality of lateral transistor structures is built in the nitride semiconductor layer provided in a silicon substrate. A semiconductor circuit is formed in one nitride semiconductor device by incorporating the plurality of transistor structures therein.

SUMMARY

In a lateral nitride semiconductor device, there may be a case where a conductive substrate is fixed to specific potential (e.g., ground potential). In this case, if the transistor structures operate independently from each other, there may be a case where a potential difference between a main electrode of each of the transistor structures and the conductive substrate varies among the transistor structures. Consequently, characteristics of each of the transistor structures may deviate from a design value, and the semiconductor circuit may fail to operate normally, causing a lack of reliability. The present disclosure provides an art to realize a nitride semiconductor device having high reliability.

A nitride semiconductor device disclosed herein comprises: a conductive substrate having conductive property; and a nitride semiconductor layer disposed on the conductive substrate and including a first transistor structure of a lateral type and a second transistor structure of a lateral type. The conductive substrate includes a first potential control region and a second potential control region. The second potential control region is capable of controlling potential independently from the first potential control region. In this nitride semiconductor device, in planar view of the nitride semiconductor layer, the first transistor structure overlaps the first potential control region. Moreover, in the planar view of the nitride semiconductor layer, the second transistor structure overlaps the second potential control region.

In the above-described nitride semiconductor device, since the conductive substrate has a plurality of potential control regions (the first potential control region and the second potential control region) provided therein, the potential of the conductive substrate can be adjusted for each of the potential control regions. Consequently, the potential difference between one of a pair of main electrodes (typically, an electrode on a lower potential side) and the conductive substrate can be adjusted for each of the transistor structures. That is, the respective potential differences between the one of the main electrodes and the conductive substrate in all of the transistor structures can be made the same. Notably, "the respective potential differences between the one of the main electrodes and the conductive substrate being the same" includes a case where the potential difference is zero (i.e., the case of being short-circuited). Moreover, "the nitride semiconductor layer including a first transistor structure of a lateral type and a second transistor structure of a lateral type" means that at least two lateral transistor structures are disposed in the nitride semiconductor layer, and there may be a case where three or more lateral transistor structures are disposed. Regarding the "conductive substrate" as well, at least two potential control regions may only have to be disposed, and there may be a case where three or more potential control regions are disposed.

The present disclosure also provides a method of manufacturing a nitride semiconductor device. The manufacturing method comprises: forming a nitride semiconductor layer; forming a plurality of transistor structures; and dividing into potential control regions. In the forming of the nitride semiconductor layer, the nitride semiconductor layer is formed on a conductive substrate. In the forming of the plurality of transistor structures, the plurality of transistor structures is formed in the nitride semiconductor layer. In the dividing into the potential control regions, the conductive substrate is divided into the plurality of potential control regions configured capable of controlling potential independently from each other.

DETAILED DESCRIPTION

Some of technical features disclosed herein will hereinafter be summarized. Notably, each of the items described below has independent technical usefulness.

The nitride semiconductor device disclosed herein includes a conductive substrate and a nitride semiconductor layer. As a material of the conductive substrate, silicon, silicon carbide, gallium nitride, or the like can be implemented. The conductive substrate may be made by introducing impurities into one of these materials. Notably, the impurities may be either n-type impurities or p-type impurities. The conductive substrate may be divided into a plurality of potential control regions configured capable of controlling potential independently from each other. The plurality of potential control regions may have a first potential control region and a second potential control region. That is, the conductive substrate may include at least the first potential control region and the second potential control region capable of controlling potential independently from the first potential control region.

Each of the potential control regions may be isolated from another potential control region by an isolation region. That is, between the first potential control region and the second potential control region, the isolation region configured to electrically isolate the first potential control region and the second potential control region may be provided. The isolation region may have insulating property. The isolation region may be formed by physically processing the conductive substrate. For example, a part of the conductive substrate may be etched to provide a trench extending from a front surface to a rear surface of the conductive substrate, and the potential control regions may be isolated from each other by the trench. In this case, the trench is the isolation region. Notably, an insulator may be embedded in the trench. As the insulator, polyimide can be listed, for example. Alternatively, the isolation region may be formed by chemically processing the conductive substrate. For example, a part of the conductive substrate may be oxidized to thereby form an isolation region.

The nitride semiconductor layer is provided on the conductive substrate. The nitride semiconductor layer may be the one having a general formula expressed as $In_XAl_YGa_{1-X-Y}N$ ($0 \leq X \leq 1$, $0 \leq Y \leq 1$, $0 \leq 1-X-Y \leq 1$). The nitride semiconductor layer may be the one obtained by stacking nitride semiconductors that have different compositions. For example, the nitride semiconductor layer may include a heterojunction layer In a part of a front surface of the heterojunction layer, a p-type nitride semiconductor region may be provided. The p-type nitride semiconductor region may have a function of depleting a part of a two-dimensional electron gas layer formed near a heterojunction interface. The nitride semiconductor layer may be an epitaxial layer. Notably, the nitride semiconductor layer may be provided on the conductive substrate with a buffer layer interposed therebetween. The buffer layer may be another nitride semiconductor that has a composition different from the composition of the nitride semiconductor layer. Moreover, the buffer layer may have higher resistance than the conductive substrate. The buffer layer having higher resistance can prevent the potential control regions from being brought into conduction with each other, and being equipotential unintentionally. Notably, if the conductive substrate and the nitride semiconductor layer are made of the same material, the buffer layer may be dispensed with. In this case, a semiconductor layer that has higher resistance than the conductive substrate may be provided between the conductive substrate and the nitride semiconductor layer.

A plurality of lateral transistor structures may be provided inside the nitride semiconductor layer. The plurality of lateral transistor structures may have a first transistor structure and a second transistor structure. That is, the nitride semiconductor layer may have at least a first transistor structure of a lateral type and a second transistor structure of a lateral type formed therein. The first transistor structure may be disposed in the nitride semiconductor layer so as to correspond to the above-described first potential control region, and the second transistor structure may be disposed in the nitride semiconductor layer so as to correspond to the above-described second potential control region. Specifically, in planar view of the nitride semiconductor layer, the first transistor structure may overlap the first potential control region and the second transistor structure may overlap the second potential control region.

Notably, the term "overlap" described above does not mean that, in the planar view, the first transistor structure completely coincides with the first potential control region (the second transistor structure completely coincides with the second potential control region). For example, as long as most part of the first transistor structure overlaps the first potential control region, a part of the first transistor structure may overlap the second potential control region. Similarly, as long as most part of the second transistor structure overlaps the second potential control region, a part of the second transistor structure may overlap the first potential control region. More specifically, in the planar view, a space between a pair of main electrodes in the first transistor structure may only have to be located within the first potential control region, and outside of the space between the pair of main electrodes may be located within the second potential control region. Similarly, a space between a pair of main electrodes in the second transistor structure may only have to be located within the second potential control region, and outside of the space between the pair of main electrodes may be located within the first potential control region.

Each of the transistor structures may be a Schottky gate transistor, a MOS transistor, or the like. Moreover, a semiconductor structure other than the lateral transistor structure may be provided inside the nitride semiconductor layer. For example, a lateral diode structure may be provided in the nitride semiconductor layer. The diode structure may be a PN diode, a Schottky barrier diode that has a JBS (Junction Barrier Schottky) structure, or the like.

An element isolation structure configured to electrically isolate the plurality of transistor structures from each other may be provided inside the nitride semiconductor layer. The element isolation structure may electrically isolate the transistor structure and the diode structure. In the planar view of the nitride semiconductor layer, the element isolation structure may overlap the above-described isolation region. The element isolation structure may be formed by implanting ions into a part of the front surface of the nitride semiconductor layer. Notably, the term "overlap" herein does not intend that the element isolation structure should completely coincide with the isolation region, either. At least apart of the element isolation structure may only have to overlap a part of the isolation region.

The conductive substrate may be provided on a rear surface of the nitride semiconductor layer, and the pair of main electrodes connected to the transistor structure may be provided on the front surface of the nitride semiconductor layer. The pair of main electrodes may include a higher potential side electrode that is connected to a higher potential side and a lower potential side electrode that is connected to a lower potential side. Moreover, each one of the pair of main electrodes may be short-circuited to the corresponding potential control region. Specifically, one of the pair of main electrodes corresponding to the first transistor structure may be short-circuited to the first potential control region, and one of the pair of main electrodes corresponding to the second transistor structure may be short-circuited to the second potential control region.

One of the above-described main electrodes may be connected to the potential control region via a wiring. Alternatively, a through hole extending from the front surface of the nitride semiconductor layer to the conductive substrate may be provided, and the through hole may be filled with a conductive member, and one of the above-described main electrodes and the potential control region may be connected via the conductive member. Specifically, the nitride semiconductor device may comprise a conductive member with which the through hole extending from the front surface to the rear surface of the nitride semiconductor layer is filled. Notably, a plurality of the through holes each extending from the front surface to the rear surface of the nitride semiconductor layer may be provided, and each of the through holes may be filled with the conductive member. The plurality of conductive members may have a first conductive member and a second conductive member In this case, one of the main electrodes corresponding to the first transistor structure may be short-circuited to the first potential control region via the first conductive member, and one of the main electrodes corresponding to the second transistor structure may be short-circuited to the second potential control region via the second conductive member. Notably, the lower potential side electrode, among the pair of main electrodes, may be short-circuited to the potential control region.

According to a manufacturing method disclosed herein, a nitride semiconductor device having a plurality of transistor structures provided in a nitride semiconductor layer provided on a conductive substrate is obtained. The manufacturing method may include: forming a nitride semiconductor layer; forming a plurality of transistor structures; and dividing into potential control regions. In the forming of the nitride semiconductor layer, the nitride semiconductor layer is formed on a conductive substrate. In the forming of transistor structures, a plurality of transistor structures is formed in the nitride semiconductor layer. In the dividing into the potential control regions, the conductive substrate is divided into a plurality of potential control regions configured capable of controlling potential independently from each other. Whichever of the forming of the plurality of transistor structures or the dividing into the potential control regions may be performed earlier than the other. Moreover, the forming of the plurality of transistor structures may be performed during the course of the dividing into the potential control regions. Notably, the nitride semiconductor layer may be provided on the conductive substrate by bonding the conductive substrate and the nitride semiconductor layer. Alternatively, the nitride semiconductor layer may be crystal-grown (epitaxially grown) on the conductive substrate. A buffer layer may be grown on the conductive substrate, and then the nitride semiconductor layer may be crystal-grown. Notably, if the nitride semiconductor layer is to be epitaxially grown, an SOI substrate, for example, cannot be used for the epitaxial growth. That is, the nitride semiconductor layer cannot be insulated from the conductive substrate, and each of the transistor structures is inevitably affected by the potential of the conductive substrate. The art disclosed herein is useful in the case where the nitride semiconductor layer is an epitaxial layer.

In the dividing into the potential control regions, a trench extending from the front surface to the rear surface of the conductive substrate may be formed. By forming the trench, the conductive substrate is physically divided thereby to form a plurality of potential control regions mutually insulated (electrically independent). In the dividing into the potential control regions, a thickness of the conductive substrate may be reduced before forming the trench. A depth of the trench can be made shallow, which simplifies the dividing into the potential control regions (etching). Moreover, in the dividing into the potential control regions, the trench may be filled with an insulating material after forming the trench. Notably, in the dividing into the potential control regions, a part of the conductive substrate may be changed to have insulating property, to thereby divide the conductive substrate into the plurality of potential control regions.

Embodiments

Figure 1:
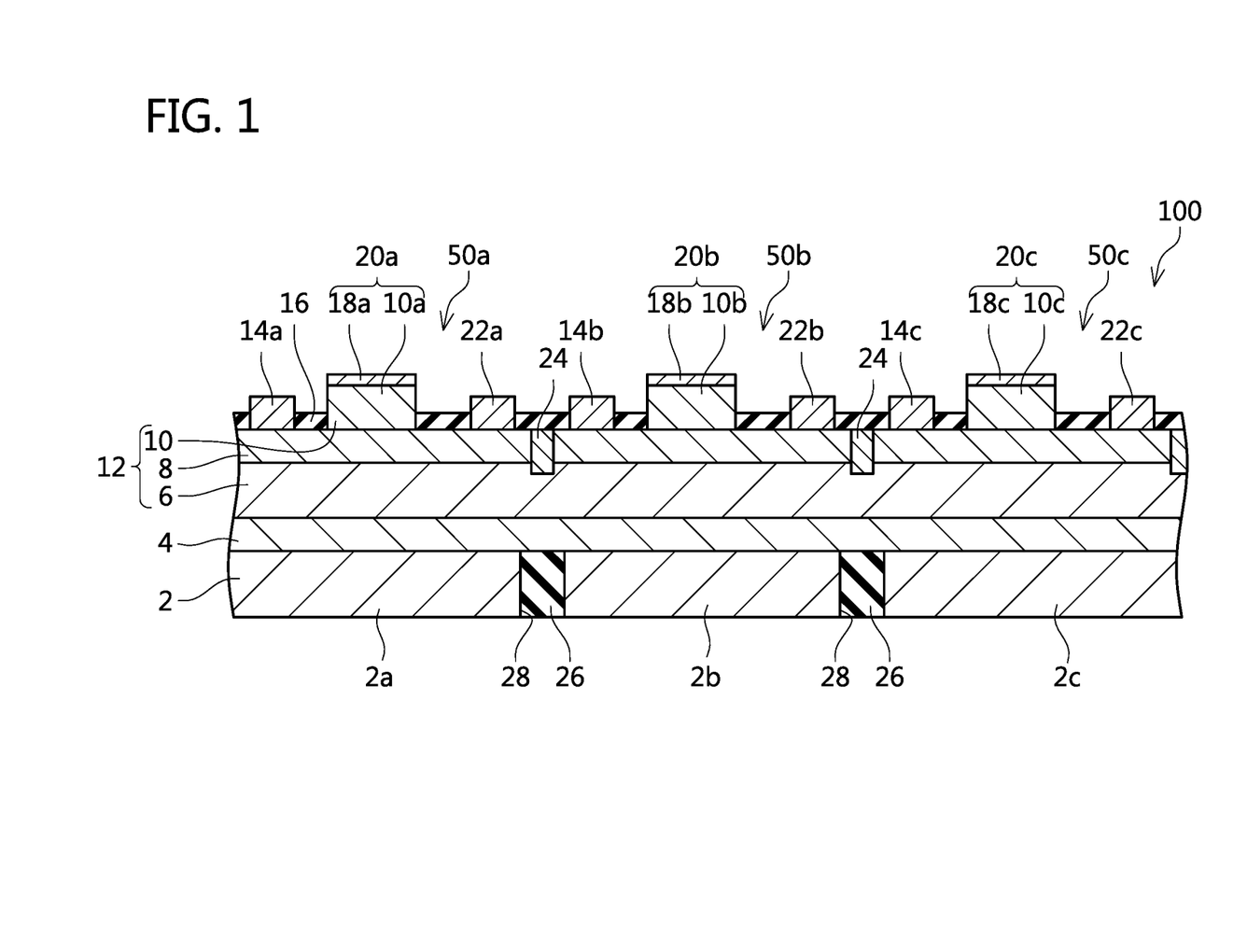
FIG. 1 shows a cross-sectional view of a nitride semiconductor device in a first embodiment.

With reference to FIG. 1, a nitride semiconductor device 100 will be described. The nitride semiconductor device 100 comprises a plurality of transistor structures provided in a common nitride semiconductor layer 12. Specifically, the nitride semiconductor device 100 includes a first transistor structure 50a, a second transistor structure 50b, and a third transistor structure 50c. Each of the transistor structures 50a, 50b, and 50c is a lateral transistor structure. Notably, in the description below, the alphabets a, b, and c may be omitted where a structure common to the transistor structures 50a, 50b, and 50c is described.

The nitride semiconductor layer 12 is provided on a front surface of a silicon substrate 2 with a buffer layer 4 interposed therebetween. The silicon substrate 2 has p-type impurities introduced therein. A thickness of the silicon substrate 2 is adjusted to 400 to 600 µm. The silicon substrate 2 is one example of the conductive substrate. Moreover, a material of the buffer layer 4 is aluminum nitride (AlN). The nitride semiconductor layer 12 includes a first nitride semiconductor layer 6, a second nitride semiconductor layer 8, and a third nitride semiconductor layer 10. The second nitride semiconductor layer 8 is provided on a front surface of the first nitride semiconductor layer 6, and the third nitride semiconductor layer 10 is provided on a front surface of the second nitride semiconductor layer 8. The third nitride semiconductor layer 10 is provided on a part of the front surface of the second nitride semiconductor layer 8. A material of the first nitride semiconductor layer 6 is gallium nitride (GaN), a material of the second nitride semiconductor layer 8 is aluminum gallium nitride (AlGaN), and a material of the third nitride semiconductor layer 10 is gallium nitride. The first nitride semiconductor layer 6 and the second nitride semiconductor layer 8 form a heterojunction. Each of the nitride semiconductor layers 6 and 8 is non-doped, while the third nitride semiconductor layer 10 contains magnesium (Mg) as p-type impurities. An impurity concentration of the third nitride semiconductor layer 10 is adjusted to $7\times10^{18}$ to $2\times10^{19}$ cm$^{-3}$. Notably, as a material of the buffer layer 4, aluminum gallium nitride may also be used instead of aluminum nitride.

Element isolation structures 24 are provided in the nitride semiconductor layer 12. Each element isolation structure 24 extends from the front surface of the second nitride semiconductor layer 8 to an inside of the first nitride semiconductor layer 6. That is, the element isolation structures 24 divide a heterojunction interface between the first and second nitride semiconductor layers 6 and 8. The transistor structures 50a, 50b, and 50c are electrically divided from each other by the element isolation structures 24. That is, a range of each of the transistor structures 50a, 50b, and 50c is delimited by the adjacent element isolation structures 24. Notably, the element isolation structures 24 are formed by introducing nitrogen (N) ions into the nitride semiconductor layer 12.

On a front surface of the nitride semiconductor layer 12, a source electrode 14, a drain electrode 22, and a gate electrode 18 are provided. The source electrode 14 and the drain electrode 22 are provided apart on the front surface of the second nitride semiconductor layer 8. The gate electrode 18 is provided on a front surface of the third nitride semiconductor layer 10. The gate electrode 18 and the third nitride semiconductor layer 10 form a gate portion 20 of each transistor structure 50. The gate portion 20 is provided between the source electrode 14 and the drain electrode 22. A material of the gate electrode 18 is nickel (Ni). Each of the source electrode 14 and the drain electrode 22 is a laminated electrode made of titanium and aluminum. The source electrode 14 and the drain electrode 22 are insulated from the gate portion 20 by a passivation film 16. As the passivation film 16, silicon nitride (SiN), silicon oxide ($SiO_2$), or the like is implemented.

The silicon substrate 2 has a plurality of trenches 28 formed therein. Each of the trenches 28 extends from the front surface (on a nitride semiconductor layer 12 side) to a rear surface of the silicon substrate 2. Each trench 28 is filled with polyimide 26. The silicon substrate 2 is divided by the trenches 28 into a first potential control region 2a, a second potential control region 2b, and a third potential control region 2c. The potential control regions 2a, 2b, and 2c are mutually insulated, and capable of controlling potential independently from each other. Each of the trenches 28 is equivalent to the isolation region provided in the silicon substrate 2. The first potential control region 2a is connected to the source electrode 14a, the second potential control region 2b is connected to the source electrode 14b, and the third potential control region 2c is connected to the source electrode 14c, by wirings (not shown), respectively. Notably, in planar view of the nitride semiconductor layer 12 (i.e., when observed along a direction orthogonal to the front surface of the nitride semiconductor layer 12), the trenches 28 overlap the element isolation structures 24.

The first, second, and third transistor structures 50a, 50b, and 50c are placed in the nitride semiconductor layer 12 to correspond to the first, second, and third potential control regions 2a, 2b, and 2c, respectively. More specifically, in the planar view of the nitride semiconductor layer 12, the first transistor structure 50a overlaps the first potential control region 2a, the second transistor structure 50b overlaps the second potential control region 2b, and the third transistor structure 50c overlaps the third potential control region 2c. Notably, the trenches 28 are formed by etching a part of the silicon substrate 2 from the rear surface toward the front surface (toward the nitride semiconductor layer 12 side), which will be described later in details. At this occasion, bottoms of the trenches 28 may reach an inside of the buffer layer 4.

The transistor structure 50 will be described. The transistor structure 50 is a normally-off type HFET (Heterostructure Field Effect Transistor), and utilizes, as a channel, a two-dimensional electron gas layer formed near the heterojunction interface. Specifically, when a positive voltage is applied to the drain electrode 22, a ground voltage is applied to the source electrode 14, and a positive voltage (an on voltage) is applied to the gate portion 20, electrons implanted from the source electrode 14 pass through the two-dimensional electron gas layer, and travel toward the drain electrode 22. When on voltage is not applied to the gate portion 20, a depletion layer extends from the third nitride semiconductor layer 10 toward the heterojunction interface. The depletion layer depletes the electrons in the two-dimensional electron gas layer, causing the travel of electrons from the source electrode 14 toward the drain electrode 22 to be stopped. That is, when on voltage is not applied to the gate portion 20, the transistor structure 50 maintains an off state, and when on voltage is applied to the gate portion 20, the transistor structure 50 switches to an on state. The transistor structure 50 is a normally-off type transistor.

As described above, in the nitride semiconductor device 100, the potential control regions 2a, 2b, and 2c are capable of controlling potential independently from each other. Accordingly, even if the source electrodes 14a, 14b, and 14c have different potentials, respectively, the transistor structures 50a, 50b, and 50c can be ensured to exhibit a same potential difference (or, exhibit a potential difference of zero) between the source electrode 14 and the potential control region (the silicon substrate) 2. Deviation of an operation of each of the transistor structures 50a, 50b, and 50c from a design value can be restrained.

Figure 9:
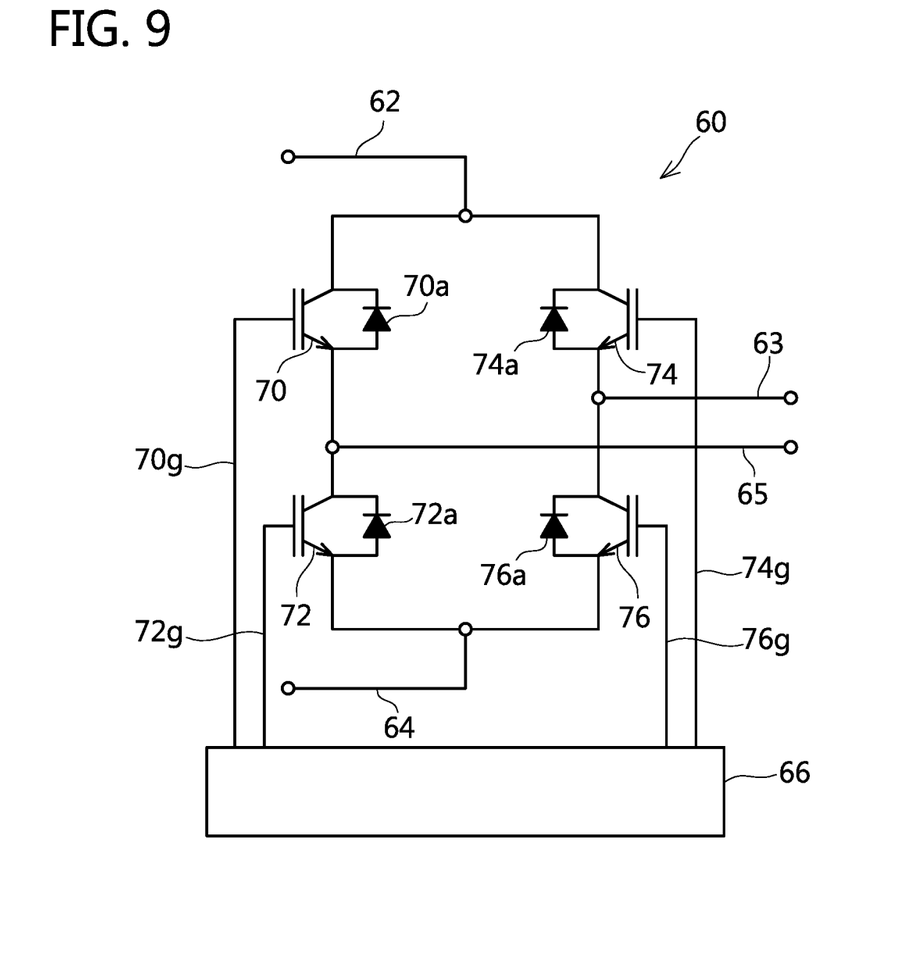
FIG. 9 shows a diagram of a semiconductor circuit formed by each of the nitride semiconductor devices in the first to fourth embodiments.

Here, with reference to FIG. 9, a semiconductor circuit 60 that uses the nitride semiconductor device 100 will be described. The semiconductor circuit 60 includes four transistors 70, 72, 74, and 76. The transistors 70, 72, 74, and 76 form a full bridge circuit. Specifically, the transistors 70 and 72 are connected in series, the transistors 74 and 76 are connected in series, and the transistors 70 and 74 are connected in parallel. An input/output wiring 65 is connected between the transistors 70 and 72. Moreover, an input/output wiring 63 is connected between the transistors 74 and 76.

The transistors 70 and 74 are connected to a higher potential wiring 62 and form an upper arm circuit. The transistors 72 and 76 are connected to a lower potential wiring 64 and form a lower arm circuit. Gate wirings 70g, 72g, 74g, and 76g are connected to the transistors 70, 72, 74, and 76, respectively. Each of the gate wirings 70g, 72g, 74g, and 76g is connected to a controller 66. The controller 66 can output different control signals to the gate wirings 70g, 72g, 74g, and 76g, respectively. That is, the transistors 70, 72, 74, and 76 can be driven independently from each other. Moreover, feedback diodes 70a, 72a, 74a, and 76a are connected to the transistors 70, 72, 74, and 76, respectively.

The transistor structures 50a, 50b, and 50c shown in FIG. 1 can be applied to any of the transistors 70, 72, 74, and 76. For example, the first transistor structure 50a can constitute the transistor 70, the second transistor structure 50b can constitute the transistor 74, and the third transistor structure 50c can constitute the transistor 72. Notably, a transistor structure that corresponds to the transistor 76 may be provided in the nitride semiconductor layer 12. In this case, a source potential of each of the transistors 70 and 74 (the transistor structures 50a and 50b) varies. In the case of the nitride semiconductor device 100, however, the first potential control region 2a to which the source electrode 14a is connected, and the second potential control region 2b to which the source electrode 14b is connected are electrically independent from other potential control regions. Accordingly, the potential difference between the source electrode and the potential control region (the substrate) in each of the transistor structures 50a and 50b can be made equal to the potential difference between the source electrode and the potential control region in each of other transistor structures.

Notably, in the semiconductor circuit 60, the source potential of each of the transistors 72 and 76 does not vary. Accordingly, the source electrodes of the transistors 72 and 76 may be connected to a common potential control region. For example, if the third transistor structure 50c in FIG. 1 constitutes the transistor 72 in FIG. 9, and when a transistor structure that corresponds to the transistor 76 is to be provided in the nitride semiconductor layer 12, a potential control region in that transistor structure may be in conduction with the potential control region 2c in the transistor structure 50c. However, the source electrodes of the transistors 72 and 76 may be connected to the potential control regions capable of controlling potential independently, respectively. For example, the first transistor structure 50a may constitute the transistor 72, and the second transistor structure 50b may constitute the transistor 76. In this case, the potential control region 2a in the transistor 72 and the potential control region 2b in the transistor 76 are not in conduction, and are capable of controlling potential independently.

Alternatively, the first transistor structure 50*a* may constitute the transistor 70, the second transistor structure 50*b* may constitute the transistor 72, and the third transistor structure 50*c* may constitute the transistor 76. In this case as well, the first potential control region 2*a* and the second potential control region 2*b* are electrically independent, and hence the transistors 70 and 72 can be ensured to exhibit a same potential difference between the source electrode and the potential control region. Notably, in this case as well, a transistor structure that corresponds to the transistor 74 may be provided in the nitride semiconductor layer 12.

Figure 2:
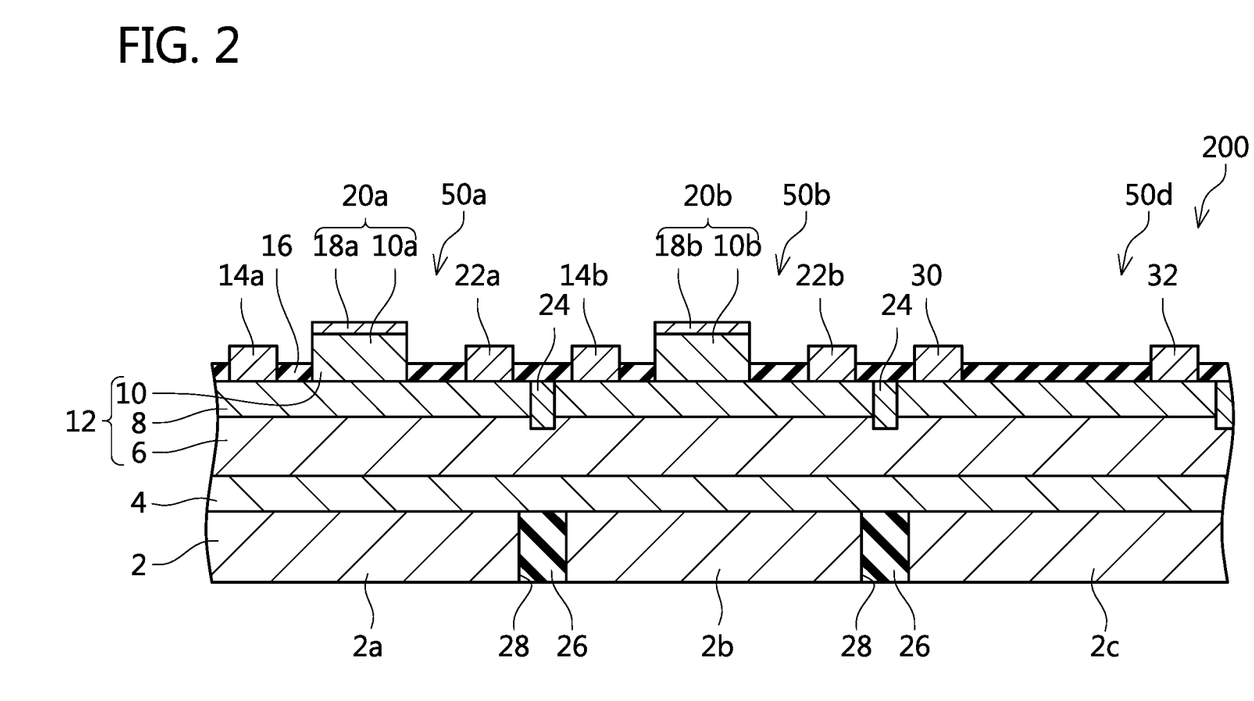
FIG. 2 shows a cross-sectional view of a nitride semiconductor device in a second embodiment.

With reference to FIG. 2, a nitride semiconductor device 200 in a second embodiment will be described. The nitride semiconductor device 200 is a variation of the nitride semiconductor device 100, and differs from the nitride semiconductor device 100 in that a diode structure is provided in the nitride semiconductor layer 12. Regarding the nitride semiconductor device 200, the description of the same structures as those of the nitride semiconductor device 100 will be omitted, by attaching the same reference numbers as those in the nitride semiconductor device 100 thereto.

The nitride semiconductor device 200 includes the first transistor structure 50*a*, the second transistor structure 50*b*, and a diode 50*d*. The diode 50*d* comprises the nitride semiconductor layer 12, an anode electrode 32, and a cathode electrode 30. The anode electrode 32 and the cathode electrode 30 are placed apart from each other on the nitride semiconductor layer 12. The anode electrode 32 and the cathode electrode 30 are mutually insulated by the passivation film 16. In the nitride semiconductor device 200 as well, each of the first and second transistor structures 50*a* and 50*b* can constitute any of the transistors 70, 72, 74, and 76 (see FIG. 9). Moreover, the diode 50*d* can constitute any of the diodes 70*a*, 72*a*, 74*a*, and 76*a*. Notably, all of the transistors 70, 72, 74, and 76 and the diodes 70*a*, 72*a*, 74*a*, and 76*a*, shown in FIG. 9, may be provided in the nitride semiconductor layer 12.

Figure 3:
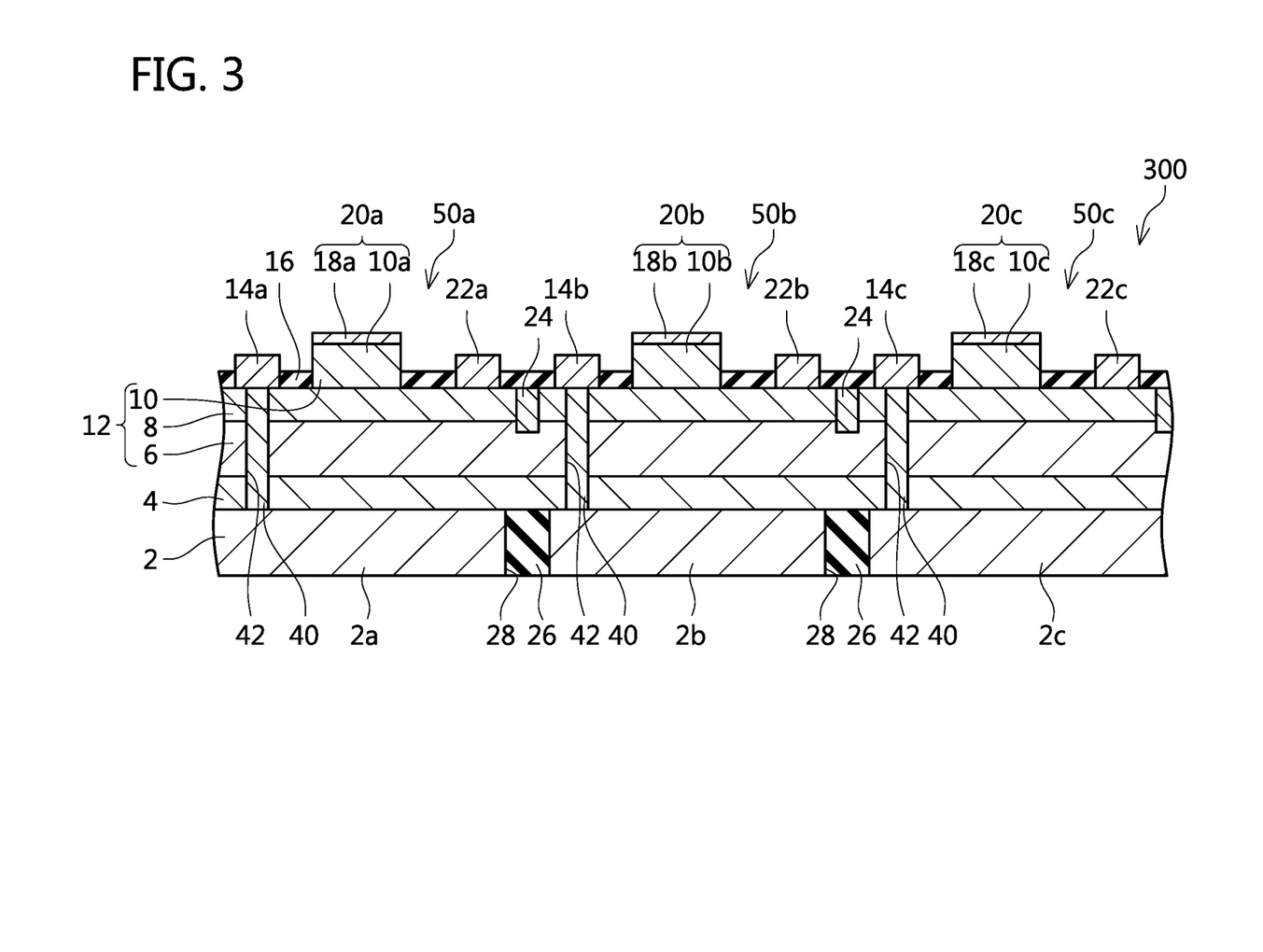
FIG. 3 shows a cross-sectional view of a nitride semiconductor device in a third embodiment.

With reference to FIG. 3, a nitride semiconductor device 300 in a third embodiment will be described. The nitride semiconductor device 300 is a variation of the nitride semiconductor device 100, and differs from the nitride semiconductor device 100 in how the source electrode 14 and the silicon substrate 2 (each of the potential control regions 2*a* to 2*c*) are connected. Regarding the nitride semiconductor device 300, the description of the same structures as those of the nitride semiconductor device 100 will be omitted, by attaching the same reference numbers as those in the nitride semiconductor device 100 thereto.

In the nitride semiconductor device 300, through holes 42 each extending from the front surface of the nitride semiconductor layer 12 to the silicon substrate 2 is provided. Each through hole 42 is filled with the conductive member 40. A material of the conductive member 40 is aluminum. The through hole 42 is filled with the conductive member 40 by a sputtering method or the like. The conductive member 40 connects each source electrode 14 and the potential control region 2*a*, 2*b*, or 2*c* that corresponds to that source electrode. That is, the conductive member 40 short-circuits the source electrode 14*a* and the first potential control region 2*a*, short-circuits the source electrode 14*b* and the second potential control region 2*b*, and short-circuits the source electrode 14*c* and the third potential control region 2*c*. In the nitride semiconductor device 300, by using the conductive member 40 placed in the nitride semiconductor layer 12, the wirings that connect the source electrodes 14 and the potential control regions 2*a* to 2*c*, respectively can be dispensed with. Notably, each through hole 42 does not isolate the transistor structures 50*a*, 50*b*, and 50*c* from each other. In an inside of each of the transistor structures 50*a*, 50*b*, and 50*c*, the through hole 42 extends from the front surface of the nitride semiconductor layer 12 to the silicon substrate 2.

Figure 4:
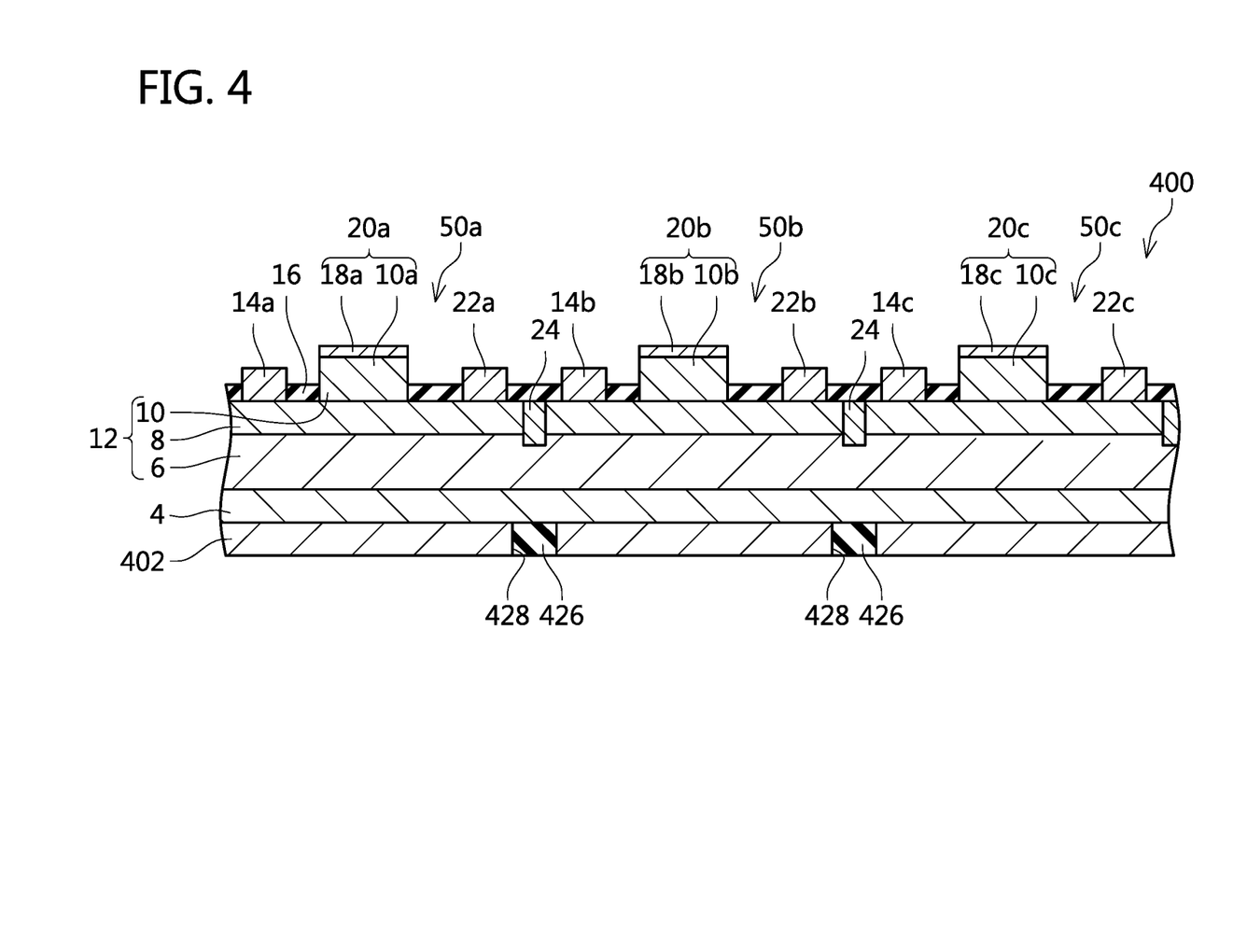
FIG. 4 shows a cross-sectional view of a nitride semiconductor device in a fourth embodiment.

With reference to FIG. 4, a nitride semiconductor device 400 in a fourth embodiment will be described. The nitride semiconductor device 400 is a variation of the nitride semiconductor device 100, and a thickness of a silicon substrate 402 differs from the thickness of the silicon substrate 2 in the nitride semiconductor device 100. Specifically, the thickness of the silicon substrate 402 is adjusted to 50 to 100 μm. Trenches 428 are provided in the silicon substrate 402, and the trenches 428 are filled with polyimide 426. Other structures of the nitride semiconductor device 400 are the same as those of the nitride semiconductor device 100, and hence the description thereof will be omitted, by attaching the same reference numbers as those in the nitride semiconductor device 100 thereto.

Figure 5:
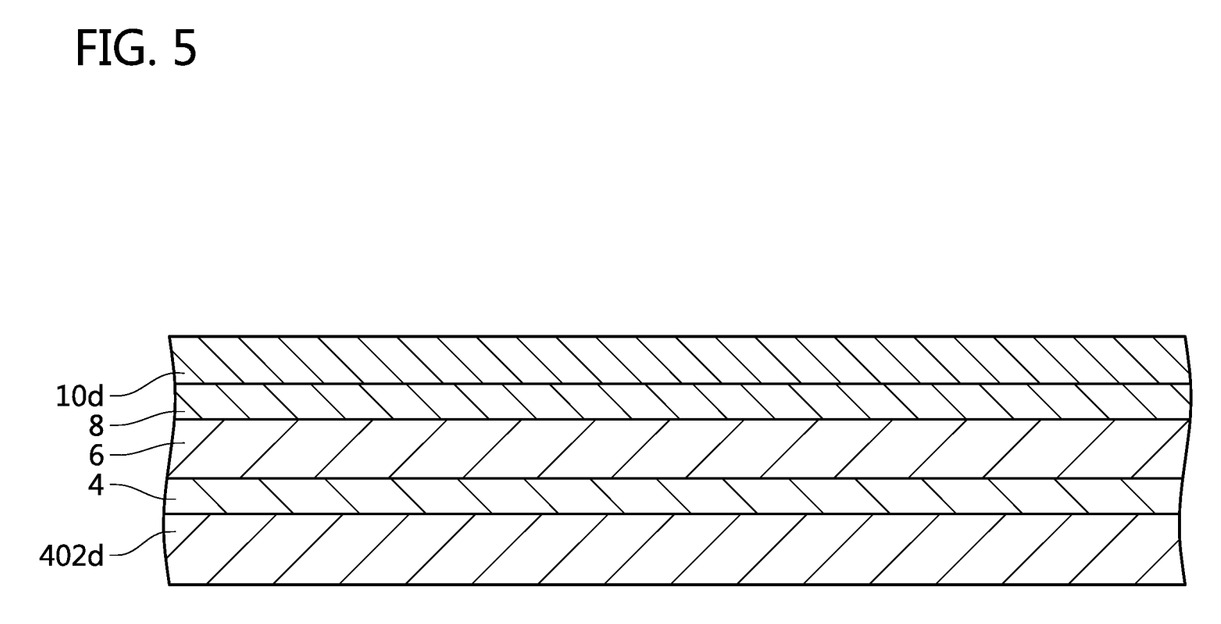
FIG. 5 shows a step of manufacturing the nitride semiconductor device in the fourth embodiment.

With reference to FIGS. 5 to 8, a method of manufacturing the nitride semiconductor device 400 will be described. Initially, as shown in FIG. 5, the buffer layer 4, a material of which is AlN, is grown on a front surface of a silicon substrate 402*d*. The buffer layer 4 is grown at approximately 700° C. Thereafter, the first nitride semiconductor layer 6, a material of which is GaN, is crystal-grown, the second nitride semiconductor layer 8, a material of which is AlGaN, is crystal-grown, and the third nitride semiconductor layer 10*d*, a material of which is GaN, is crystal-grown. A nitride semiconductor layer forming step is completed. When the third nitride semiconductor layer 10*d* is crystal-grown, $Cp_2Mg$ (cyclopentadienyl magnesium) is introduced into a raw material gas. Each of the nitride semiconductor layers 6, 8, and 10*d* is crystal-grown at approximately 1000° C. Notably, a thickness of the silicon substrate 402*d* is adjusted to 400 to 600 μm. Notably, the buffer layer 4, a material of which is AlGaN, may be grown on a front surface of the silicon substrate 402*d*.

Figure 6:
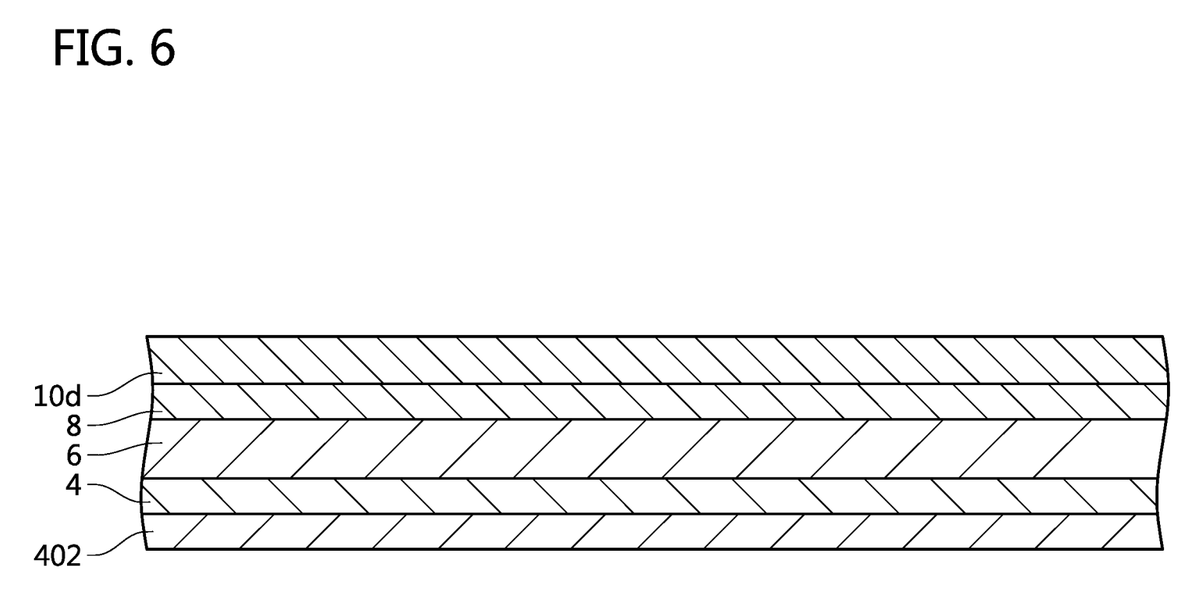
FIG. 6 shows a step of manufacturing the nitride semiconductor device in the fourth embodiment.
Figure 7:
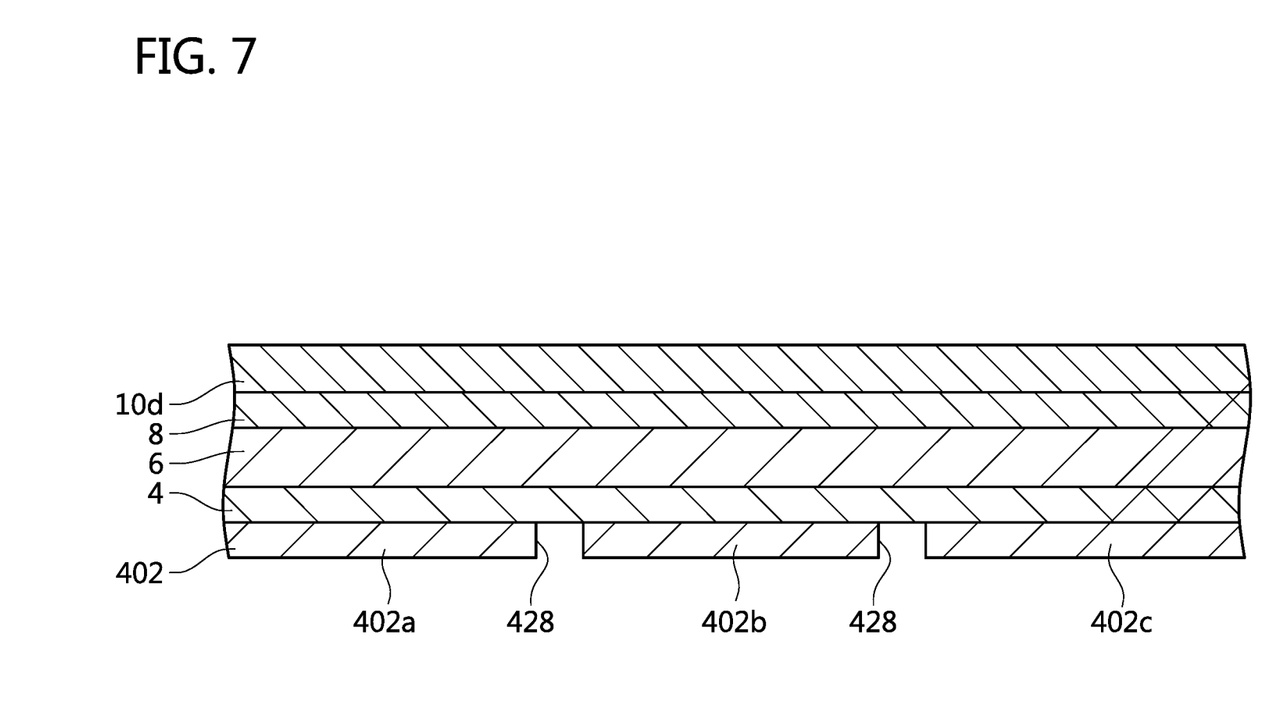
FIG. 7 shows a step of manufacturing the nitride semiconductor device in the fourth embodiment.

Next, as shown in FIG. 6, a rear surface of the silicon substrate 402*d* is ground to complete the silicon substrate 402, the thickness of which is adjusted to 50 to 100 μm. The thickness of the silicon substrate 402 in FIG. 6 is the same as the thickness of the silicon substrate 402 shown in FIG. 4. Afterwards, as shown in FIG. 7, a part of the silicon substrate 402 is etched to form trenches 428. The trenches 428 are equivalent to the trenches 428 in FIG. 4. By grinding the silicon substrate 402*d*, the depth of the trench 428 can be reduced, thereby simplifying a forming step of trenches (see FIG. 1 for comparison). The formation of the trenches 428 causes the silicon substrate 402 to be divided into potential control regions 402*a*, 402*b*, and 402*c*.

Figure 8:
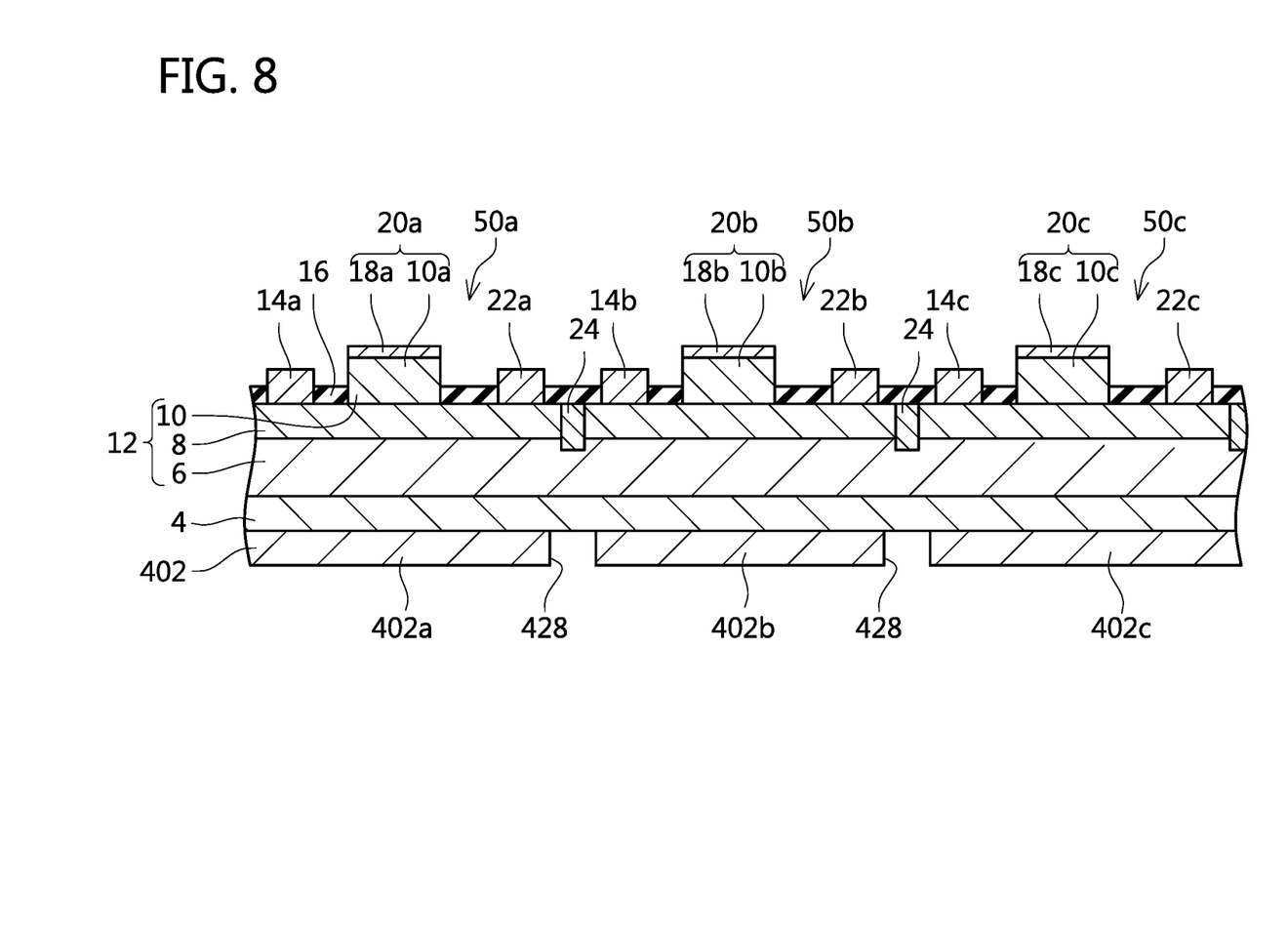
FIG. 8 shows a step of manufacturing the nitride semiconductor device in the fourth embodiment.

Next, as shown in FIG. 8, the source electrodes 14, the drain electrodes 22, the gate electrodes 18, and the like are formed on the front surface of the nitride semiconductor layer 12 to form the transistor structures 50. In each transistor structure 50, an etching mask (not shown) is formed on a part of a front surface of the third nitride semiconductor layer 10*d* in FIG. 7, and a portion of the third nitride semiconductor layer 10*d* where no etching mask is formed is etched until the second nitride semiconductor layer 8 is exposed. The third nitride semiconductor layer 10 (10*a* to 10*c*) shown in FIG. 8 is thereby completed. Thereafter, an etching mask (not shown) is formed on a part of the front surfaces of the second nitride semiconductor layer 8 and the third nitride semiconductor layers 10*a* to 10*c*, and nitrogen (N) ions are implanted into a portion where no etching mask is formed. The element isolation structures 24 are completed. Afterwards, the etching mask is removed, and the gate electrodes 18, the source electrodes 14, the drain electrodes 22, and the passivation film 16 are formed by a known method, to thereby complete a transistor structure forming step.

Next, the trenches 428 are filled with the polyimide 426. A step of dividing into the potential control regions is completed as described above, and the nitride semiconductor device 400 shown in FIG. 4 is completed. Notably, in the description above, an example was described in which the transistor structure forming step is performed in the course of the step of dividing into the potential control regions. Alternatively, the step of dividing into the potential control regions may be performed after the completion of the transistor structure forming step. If the trenches 428 are filled with the polyimide 426, at least the step of filling the trenches 428 with the polyimide 426 is performed after the completion of the transistor structure forming step, in order to prevent degradation of the polyimide due to heat generated when the electrodes are formed. Notably, the trenches 428 may not be filled with the polyimide 426. In this case, when the trenches 428 have been formed, the step of dividing into the potential control regions is completed. If the trenches 428 are not filled with the polyimide 426, whichever of the step of dividing into the potential control regions and the transistor structure forming step may be performed earlier than the other. Moreover, when the trenches 428 are formed, bottoms of the trenches 428 may reach the inside of the buffer layer 4.

Notably, the thickness of the silicon substrate 402*d* is the same as the thickness of the silicon substrate 2 in the nitride semiconductor device 100 (see FIG. 1). Accordingly, by eliminating the grinding in FIG. 6, the nitride semiconductor device 400 can be manufactured by substantially the same steps as those of the nitride semiconductor device 100. Moreover, by removing the third nitride semiconductor layer 10*d* in a range where the first diode 50*d* is to be provided, in the step of etching the third nitride semiconductor layer 10*d* in FIG. 8, the nitride semiconductor device 200 can be manufactured by substantially the same steps as those of the nitride semiconductor device 100. By adding a step of forming the through holes 42 each of which extends from the front surface of the nitride semiconductor layer 12 to the silicon substrate 2 in the transistor structure forming step, the nitride semiconductor device 300 can be manufactured by substantially the same steps as those of the nitride semiconductor device 100.

In the above-described embodiments, the nitride semiconductor device that has three transistor structures provided in the nitride semiconductor layer (i.e., the nitride semiconductor devices 100, 300, and 400), and the nitride semiconductor device (i.e., the nitride semiconductor device 200) that has two transistor structures and one diode structure provided in the nitride semiconductor layer are shown. However, the number of transistors provided in the nitride semiconductor layer is not limited to those in the above-described embodiments. The art disclosed herein can be applied to any of nitride semiconductor devices including two or more transistor structures in a common nitride semiconductor layer.

Moreover, in the above-described embodiments, an example was described in which the source electrode (the lower potential side electrode) and the potential control region are connected (i.e., are short-circuited). However the art disclosed herein can also be applied to an aspect in which a potential difference exists between the source electrode and the potential control region, for example. What is important is that a substrate is divided into a plurality of potential control regions, and the potential of each of the potential control regions is controlled independently from other potential control regions.

Specific examples of the present disclosure have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A nitride semiconductor device comprising:
   a conductive substrate comprising conductive property; and
   a nitride semiconductor layer disposed on the conductive substrate and including a first transistor structure of a lateral type and a second transistor structure of a lateral type,
   wherein
   the conductive substrate includes a first potential control region and a second potential control region capable of controlling potential independently from the first potential control region, and
   in planar view of the nitride semiconductor layer, the first transistor structure overlaps the first potential control region and the second transistor structure overlaps the second potential control region.

2. The nitride semiconductor device according to claim 1, wherein
   an isolation region is disposed between the first potential control region and the second potential control region, the isolation region being configured to electrically isolate the first potential control region and the second potential control region from each other.

3. The nitride semiconductor device according to claim 2, wherein
   the isolation region is a trench disposed between the first potential control region and the second potential control region.

4. The nitride semiconductor device according to claim 2, wherein
   an element isolation structure is disposed in the nitride semiconductor layer, the element isolation structure being configured to electrically isolate the first transistor structure and the second transistor structure from each other, and
   in the planar view of the nitride semiconductor layer, the element isolation structure overlaps the isolation region.

5. The nitride semiconductor device according to claim 1, wherein
   a semiconductor layer comprising higher resistance than the conductive substrate is disposed between the conductive substrate and the nitride semiconductor layer.

6. The nitride semiconductor device according to claim 1, wherein
   one of a pair of main electrodes corresponding to the first transistor structure is short-circuited to the first potential control region, and one of a pair of main electrodes corresponding to the second transistor structure is short-circuited to the second potential control region.

7. The nitride semiconductor device according to claim 6, further comprising a conductive member with which a through hole extending from a front surface of the nitride semiconductor layer to the conductive substrate is filled, wherein
- the conductive member comprises a first conductive member and a second conductive member,
- the one of the pair of main electrodes corresponding to the first transistor structure is short-circuited to the first potential control region via the first conductive member, and
- the one of the pair of main electrodes corresponding to the second transistor structure is short-circuited to the second potential control region via the second conductive member.

8. The nitride semiconductor device according to claim 6, wherein
- at least one of the first transistor structure and the second transistor structure corresponds to an upper arm of a full bridge circuit,
- the one of the pair of main electrodes corresponding to the first transistor structure is a source electrode, and
- the one of the pair of main electrodes corresponding to the second transistor structure is a source electrode.

9. The nitride semiconductor device according to claim 1, wherein each of the first transistor structure and the second transistor structure is a heterojunction field effect transistor structure.

10. The nitride semiconductor device according to claim 1, wherein the nitride semiconductor layer is an epitaxial layer.

11. A method of manufacturing a nitride semiconductor device, the method comprising:
- forming a nitride semiconductor layer on a conductive substrate;
- forming a plurality of transistor structures in the nitride semiconductor layer; and
- dividing the conductive substrate into a plurality of potential control regions configured capable of controlling potential independently from each other.

12. The method according to claim 11, wherein the dividing of the conductive substrate comprises forming a trench extending from a front surface to a rear surface of the conductive substrate.

13. The method according to claim 12, wherein the dividing of the conductive substrate comprises reducing a thickness of the conductive substrate before forming the trench.

* * * * *